United States Patent [19]

Nomoto

[11] 4,232,301

[45] Nov. 4, 1980

[54] APPARATUS FOR AUTOMATICALLY SELECTIVELY DISPLAYING INFORMATION OF A PLURALITY OF KINDS

[75] Inventor: Koh Nomoto, Tokyo, Japan

[73] Assignee: Nippon Electric Co., Ltd., Tokyo, Japan

[21] Appl. No.: 889,800

[22] Filed: Mar. 24, 1978

[30] Foreign Application Priority Data

Mar. 25, 1977 [JP] Japan ................................. 52/33728

[51] Int. Cl.² ..................... G08B 19/00; G04B 19/24; H04B 1/16
[52] U.S. Cl. ................................. 340/789; 340/52 F; 340/870.16; 235/92 ST; 235/92 TF; 455/154; 368/70
[58] Field of Search ............... 340/181, 324 R, 201 R, 340/52 F; 58/152 R; 325/455; 235/92 T, 92 TF, 92 ST, 92 EA, 92 MT, 92 FQ; 364/707

[56] References Cited

U.S. PATENT DOCUMENTS

| 3,816,730 | 6/1974 | Yamamoto et al. ............... 58/152 R |
| 3,964,018 | 6/1976 | Strait et al. ............................ 340/201 |
| 3,973,205 | 8/1976 | Tanaka ................................ 340/324 R |
| 3,996,451 | 12/1976 | Harrington et al. ............... 235/92 ST |
| 4,031,363 | 6/1977 | Freeman et al. .................. 235/92 FQ |
| 4,078,375 | 3/1978 | Kashio ............................... 235/92 T |
| 4,109,315 | 8/1978 | Pan ..................................... 364/707 |

Primary Examiner—Donald J. Yusko
Attorney, Agent, or Firm—Sughrue, Rothwell, Mion, Zinn and Macpeak

[57] ABSTRACT

Supplied usually with a first information signal, an indicator displays information carried by the signal, such as time indicated by a clock. Information carried by a second information signal, such as a frequency to which a radio receiver is tuned, is optionally variable. The second information is successively memorized in a memory and supplied to a comparator to be compared with the second information signal. The comparator produces an anticoincidence signal when the second information is subjected to a change. A timer produces a switch signal for a predetermined duration after the change of the variable information. Responsive to the switch signal, a switch temporarily supplies the indicator with the memorized information relating to the second information instead of the first information signal.

14 Claims, 2 Drawing Figures

APPARATUS FOR AUTOMATICALLY SELECTIVELY DISPLAYING INFORMATION OF A PLURALITY OF KINDS

BACKGROUND OF THE INVENTION

This invention relates to an apparatus for selectively displaying information of a plurality of kinds, among which the information of at least one kind is optionally variable and the information of at least one other kind is favorably steady or self-variable.

Apparatus is often used, which is capable of selectively displaying or indicating information of a plurality of kinds. For example, a radio receiver equipped with a clock usually displays time given by the clock by the use of a display device which may be temporarily used to display frequency or the like while selecting a desired radio broadcast program. On selecting the program, the user has had to carry out a troublesome sequence of operations. First, a change-over or display selection switch is manually operated to switch the display device from a display or indication of the time to that of the frequency. Next, a tuner or frequency selector is manipulated to select the program while the frequency is displayed. Finally, the switch is switched back to make the display again give the time. When the display looks alike as is the case with a radio receiver equipped with a digital clock, the user is liable to erroneously operate the switch and/or the selector.

SUMMARY OF THE INVENTION

It is therefore an object of the present invention to provide an apparatus for automatically selectively displaying information of a plurality of kinds, wherein the information of at least one kind is steady or self-variable and the information of at least one other kind is optionally variable.

It is another object of this invention to provide an apparatus of the type described, exempted from any erroneous operation of a manually operable display selection switch or button that has been indispensible in conventional apparatus for selection of information to be displayed.

According to this invention, there is provided an apparatus that comprises first means responsive to a first input signal for producing a first information signal representative of information of a first kind and second means responsive to a second input signal for producing a second information signal representative of information of a second kind. The information of the second kind is optionally variable. The second information signal is variable in response to a variation in the information of the second kind. The apparatus further comprises display means for displaying the information of each of at least the first and the second kinds, memory means for memorizing the second information signal to produce a memory signal representative of the information of the second kind, and comparator means for comparing the second information signal as produced with the memory signal to produce a switch signal variable between a first and a second state. The comparator means puts the switch signal in the second state for a predetermined duration after occurrence of a variation in the second information signal as produced from the memory signal. The comparator means otherwise puts the switch signal in the first state. The apparatus still further comprises switch means responsive to the switch signal for supplying the display means with the first information and the memory signals when the switch signal is in the first and the second states, respectively.

DESCRIPTION OF THE PREFERRED EMBODIMENT

Figure 1:
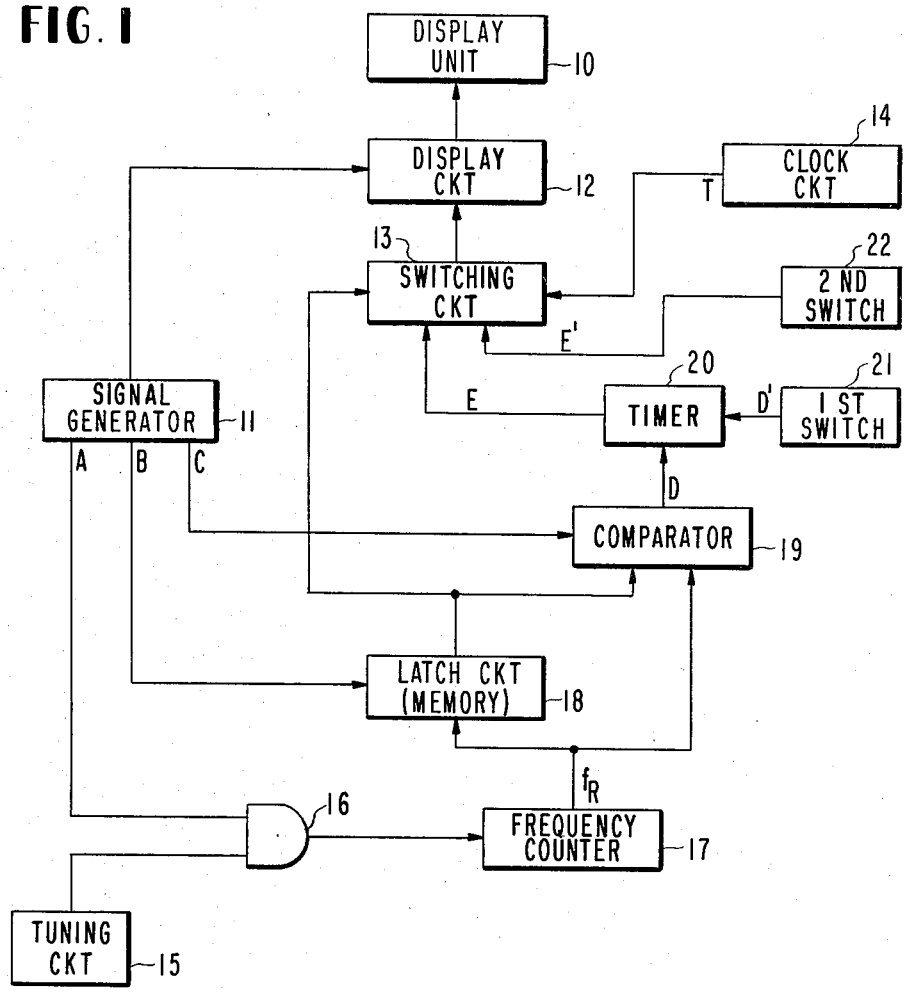
FIG. 1 is a block diagram of an apparatus according to an embodiment of the instant invention together with a portion of a radio receiver equipped with a digital clock, the apparatus being for automatically selectively displaying time given by the clock and a frequency to which the radio receiver is tuned.

Referring to FIG. 1, an apparatus according to an embodiment of the present invention is for use in combination with a radio receiver equipped with a digital clock. The apparatus comprises an indicator or display unit 10 for giving a visual display or indication of each of time T given by the clock and a tuned frequency $f_R$ to which the radio receiver is tuned by the use of a tuner or frequency selector (not shown). The indicator 10 can be made of liquid crystal elements, light emitting diodes, or a fluorescent display panel. Supplied with a sequence of timing pulses from a timing signal generator 11, an indicator or display circuit 12 energizes the indicator 10 by a set of energizing signals that correspond to a switched count signal supplied thereto from an automatic circuit 13. The indicator circuit 12 comprises a decoder (not shown) for decoding the switched count signal into the energizing signals for the indicator. The clock comprises a clock counter 14 for producing a first count signal representative of a count of the time T to supply the same to the switching circuit 12. The radio receiver comprises a tuning circuit 15 or the like for producing a tuned signal of a frequency corresponding to the tuned frequency $f_R$. The frequency of the tuned signal may be the tuned frequency $f_R$ itself. As the case may be, the tuned signal includes an intermediate frequency related to the tuned frequency $f_R$. The timing signal generator 11 further generates a first sequence of successive enabling pulses A, a second sequence of memory pulses B after the respective enabling pulses A, and a third sequence of comparison pulses C, each between one of the enabling pulses A and one of the memory pulses B that immediately follows the one enabling pulse A. Preferably, the enabling pulses A have a common pulse width and a predetermined repetition period.

The apparatus illustrated in FIG. 1 further comprises an AND gate 16 enabled by the enabling pulses A to gate the tuned signal into a sequence of information pulses, each of which has the frequency of the tuned signal. Responsive to each information pulse, a frequency counter 17 produces a second count signal representative of a count of the tuned frequency $f_R$. Timed by each memory pulse B, a latch circuit 18 memorizes the second count signal and supplies the memorized count signal as a memory signal to the switching circuit 13 and to a comparator 19. Energized by each comparison pulse C, the comparator 19 compares the second count signal currently produced by the frequency counter 17 with the memory signal to produce a result or anticoincidence signal D when the currently produced count signal is not coincident with the memory signal. Responsive to the anticoincidence signal D, a timer 20 produces a switch signal E of a predetermined duration. Unless supplied with the switch signal E, the switching circuit 13 supplies the first count signal to the indicator circuit 12 as the switched count signal to make the indicator 10 display the time T. When supplied with the switch signal E, the switching circuit 13 supplies the memory signal to the indicator circuit 12 as the switched count signal to make the indicator 10 display the tuned frequency $f_R$. The device may comprise a manual switch or button 21 for manually optionally enabling the timer 20 to make the indicator 10 display the tuned frequency $f_R$ even while the tuned frequency $f_R$ is kept unchanged. The device may either alternatively or additionally comprise another manual switch 22 for manually optionally making the switching circuit 13 supply the first count signal to the indicator circuit 12 to make the indicator 10 display the time T even in the presence of the switch signal E.

Figure 2:
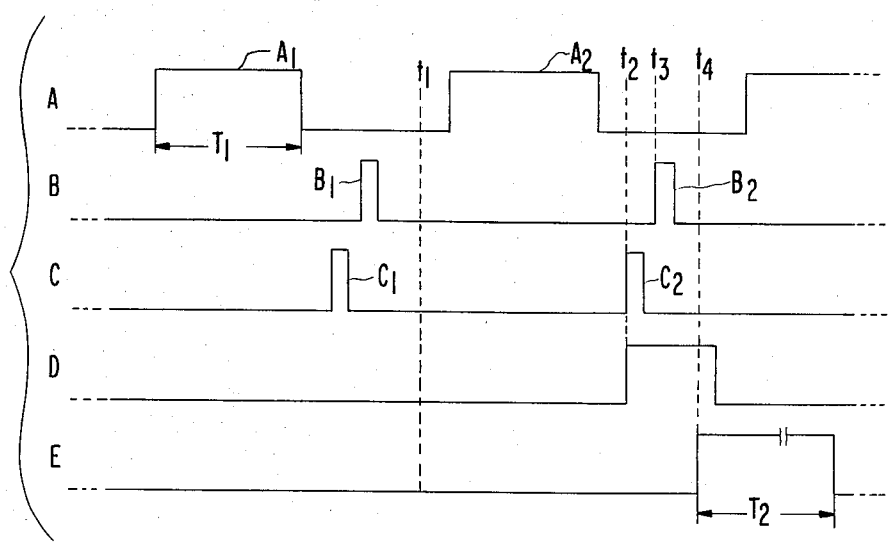
FIG. 2 is a time chart of several signals that appear at various points of the device illustrated in FIG. 1

Turning to FIG. 2, let it be surmised that a user of the device illustrated with reference to FIG. 1 starts selection of a desired radio broadcast program at a first instant $t_1$. The common pulse width of the enabling pulses A is designated by a first duration $T_1$. Prior to the instant $t_1$, a tuned signal corresponding to a first tuned frequency $f_{R1}$ (not shown) is intermittently supplied for the durations $T_1$ to the frequency counter 17 to be reproduced thereby as a sequence of second count signals representative of the first tuned frequency $f_{R1}$. One of the second count signals that is produced in response to an enabling pulse $A_1$ is written into the latch circuit 18 in response to a memory pulse $B_1$ and memorized therein for an interval between the memory pulse $B_1$ and a next subsequent memory pulse $B_2$. For a preceding interval earlier than the memory pulse $B_1$ in question, the latch circuit 18 holds a second count signal produced in response to an enabling pulse $A_O$ (not shown) preceding the illustrated enabling pulse $A_1$. Responsive to a comparison pulse $C_1$ produced between the illustrated enabling pulse $A_1$ and memory pulse $B_1$, the comparator 19 produces no anticoincidence signal D. The indicator 10 therefore continually displays the time T.

After the first instant $t_1$ depicted in FIG. 2 the tuning circuit 15 illustrated in FIG. 1 produces the tuned signal with a second tuned frequency $f_{R2}$ (not shown) that may be varying until the radio receiver is tuned to a desired frequency. A second count signal produced in response to an enabling pulse $A_2$ next following the instant $t_1$ represents the second tuned frequency $f_{R2}$. The comparator 19 therefore produces an anticoincidence signal D at a second instant $t_2$ of a comparison pulse $C_2$ that next follows the first instant $t_1$. The second count signal representative of the second tuned frequency $f_{R2}$ is substituted in the latch circuit 18 for the second count signal representative of the first tuned frequency $f_{R1}$ at a third instant $t_3$ of the memory pulse $B_2$ next following the comparison pulse $C_2$. Responsive to the anticoincidence signal D, the timer 20 starts producing a switch signal E at a fourth instant $T_4$ a prescribed period after the third instant $t_3$. The switch signal E lasts for a predetermined of second duration $T_2$. Inasmuch as the switching circuit 13 is supplied with the memory signal representative of the second tuned frequency $f_{R2}$ to be displayed by the indicator 10 for the first time at the third instant $t_3$, it is necessary when use is made of the illustrated sequences of pulses that the fourth instant $t_4$ be later than the third instant $t_3$. In other words, the prescribed period should cover or exceed the third instant $t_3$. The second duration $T_2$ is for automatically resetting the display device to indication of the time T due to the clock counter and is determined in consideration of the time required for tuning of the radio receiver to the desired frequency. The first duration $T_1$, namely, the common pulse width of the enabling pulses A should only be sufficient to make the frequency counter 17 or an equivalent unit produce the second information signal. The repetition period depends on the common pulse width. It is possible to voluntarily look for or confirm the receiving frequency by applying a display command signal D' through manual operation of the first switch 21 to generate a switch signal E with the duration $T_2$ or by applying a switch signal E' with an arbitrary duration through manual operation of the second switch 22.

It is now appreciated that an apparatus according to this invention is capable of automatically selectively displaying information of a plurality of kinds. For example, it is possible to use in a television receiver the video signal and the time count signal as two first input or information signals with the picture information deemed to be steady information and to use a signal produced either by a tuning circuit or by a channel selector as the second input signal. The second information signal now represents the channel number. The picture tube of the television receiver serves as the indicator 10. For the display of the channel number, use is possible of a small area of the viewing screen with the remaining wider area used to display the picture. It is also understood that the switch signal E may be put usually in a first state and switched to a second state for the predetermined duration $T_2$ in response to a change in the information of the second kind. For three or more kinds of information, the first state may be subdivided into a plurality of states with the respective states given either by a plurality of signal levels or by respectively coded pulse groups. When the optionally variable information is given by a sequence of numerals of a plurality of digits, the comparator 19 may compare the currently produced and the memorized variable information with each other by only one digit each, such as the least significant digit.

As described, an apparatus according to this invention is operable without the troublesome and/or erroneous operation that has been inevitable with a conventional device due to manual operation of an indispensible display section switch or button. In addition, a device according to this invention is more compact and less power consuming than the conventional device because of unnecessity of the display selection switch and the related circuitry and because of prevention of erroneous operation.

What is claimed is:

1. An apparatus comprising:
   first means for producing a first information signal representative of information of a first kind;
   second means for producing a second information signal representative of information of a second kind, the information of said second kind being optionally variable, said second information signal being variable in response to a variation in the information of said second kind;
   display means for displaying the information of any of at least said first and said second kinds;
   memory means for memorizing said second information signal;

comparator means for comparing the second information signal from said second means with the memorized second information signal from said memory means to produce a control signal representative of the result of the comparison; and switch means for switching the supply of information signals to said display means from said first information signal to said second information signal for a predetermined period of time in response to said control signal.

2. The apparatus as claimed in claim 1, further comprising:

means for coupling the output of said second means to said memory means and said comparator means;

means for coupling the output of said memory means to said comparator means and to said switch means; and means for coupling the output of said first means to said switch means.

3. The apparatus as claimed in claim 1, further comprising:

a signal generator for generating a first sequence of successive enabling pulses, a second sequence of memory pulses after the respective enabling pulses, and a third sequence of comparison pulses between the respective enabling pulses and the memory pulses produced after the respective enabling pulses;

said second means including:

terminal means for receiving said second input signal; and gate means responsive to each of said enabling pulses for gating the second input signal received by said terminal means into a gated signal that follows said each enabling pulse and serves as said second information signal;

said memory means including a memory responsive to each of said memory pulses for memorizing the gated signal following the enabling pulse after which said each memory pulse is produced, said memory thereby producing a memory output signal as the output of said memory means;

said comparator means including;

a comparator responsive to each of said comparison pulses for comparing the gated signal following the enabling pulse after which said each comparison pulse is produced with the memory output signal produced in response to the memory pulse produced before the enabling pulse after which said each comparison pulse is produced, said comparator thereby producing said control signal variable between a first and a second state, said control signal having said first state and said second state when the compared signals are coincident and anticoincident with each other, respectively; and said switch means including timer means responsive to said control signal for producing said control signal in said second state for said predetermined period of time, after the comparison pulse in response to which the comparison is carried out, said timer means otherwise putting said control signal in the first state thereof.

4. The apparatus as claimed in claim 3, further comprising means coupled to said timer means for manually optionally making said timer means put the control signal of the first state of said switch signal in the second state thereof.

5. The apparatus as claimed in claim 3, further comprising means coupled to said switch means for manually optionally making said switch means supply said display means with said first information signal even while said control signal is put in said second state.

6. The apparatus as claimed in claim 1, wherein the information of said first kind is time and the information of said second kind is frequency.

7. A device comprising:

first means for producing a first information signal representative of information of a first kind;

second means for producing a second information signal representative of information of a second kind, the information of said second kind being optionally variable, said second information signal being variable in response to a variation in the information of said second kind;

display means for displaying the information of any of at least said first and said second kinds;

memory means for memorizing said second information signal to produce a memory signal representative of the information of said second kind;

comparator means coupled with said second means and said memory means for comparing the second information signal with said memory signal to produce a result signal; third means responsive to said result signal for producing a switch signal variable between a first and a second state, said third means putting said switch signal in said second state for a predetermined duration after occurrence of a variation of the second information signal, said third means otherwise putting said switch signal in said first state; and switch means coupled with said third means and receiving the switch signal from said third means for supplying said display means with said first information signal when said switch signal is in said first state and with said memory signal when said switch signal is in said second state.

8. A device as claimed in claim 7, wherein the information of said first kind is time given by a clock, the information of said second kind being a frequency to which a radio receiver is tuned.

9. A device as claimed in claim 7, further comprising:

a signal generator for generating a first sequence of successive enabling pulses, a second sequence of memory pulses after the respective enabling pulses, and a third sequence of comparison pulses between the respective enabling pulses and the memory pulses produced after the respective enabling pulses;

said second means including;

terminal means for receiving said second input signal; and gate means responsive to each of said enabling pulses for gating the second input signal received by said terminal means into a gated signal that follows said each enabling pulse and serves as said second information signal;

said memory means including a memory responsive to each of said memory pulses for memorizing the gated signal following the enabling pulse after which said each memory pulse is produced, said memory thereby producing a memory output signal as said memory signal;

said comparator means including:

a comparator responsive to each of said comparison pulses for comparing the gated signal following the enabling pulse after which said each comparison pulse is produced with the memory output signal produced in response to the memory pulse produced before the enabling pulse after which said each comparison pulse is produced, said comparator thereby producing a result signal variable between a first and a second state, said comparator putting said result signal in the first and the second states when the compared signals are coincident and anti-coincident with each other, respectively; and said third means putting said switch signal in the second state of said switch signal for said predetermined duration a prescribed period after the comparison pulse in response to which the comparison is carried out to result in the result signal of the second state thereof.

10. A device as claimed in claim 9, further comprising means coupled to said third means for manually optionally making said third means put the switch signal of the first state of said switch signal in the second state thereof.

11. A device as claimed in claim 9, further comprising means coupled to said switch means for manually optionally making said switch means supply said display means with said first information signal even while said switch signal is put in the second state of said switch signal.

12. A device as claimed in claim 9, said device being for use in combination with a radio receiver equipped with a clock, said clock producing a first count signal, the information of said first kind being time given by said clock, said radio receiver producing a tuned signal of a frequency corresponding to a tuned frequency to which said radio receiver is tuned, the information of said second kind being said tuned frequency;

said first means receiving said first count signal as said first input signal;
said terminal means receiving said tuned signal as said second input signal;
said gate means including:
a gate circuit responsive to each of said enabling pulses for gating the tuned signal received by said terminal means into an information pulse having the frequency of said tuned signal; and
means responsive to said information pulse for producing a second count signal following the enabling pulse in response to which said information pulse is produced, said second count signal being representative of said tuned frequency to serve as said second information signal.

13. An apparatus comprising:
first means for producing a first information signal representative of a first kind;
second means for producing a second information signal representative of a second kind, a value of the information of said second kind being optionally variable;
display means for displaying the information of any of at least said first and said second kinds;
means for detecting a change in the value of said second information signal to produce a control signal when a change is detected; and
switching means for switching the supply of a signal to said display means from said first information signal to said second information signal for a predetermined period of time in response to said control signal.

14. The apparatus as claimed in claim 13, wherein the information of said first kind is time and the information of said second kind is frequency.

* * * * *

UNITED STATES PATENT AND TRADEMARK OFFICE
CERTIFICATE OF CORRECTION

PATENT NO. : 4,232,301

DATED : November 4, 1980

INVENTOR(S) : Koh NOMOTO

It is certified that error appears in the above—identified patent and that said Letters Patent is hereby corrected as shown below:

Column 2, line 32, after "matic" insert -- switching -- .

Signed and Sealed this

Third Day of March 1981

[SEAL]

Attest:

RENE D. TEGTMEYER

Attesting Officer

Acting Commissioner of Patents and Trademarks